US012482672B2

(12) United States Patent
Tanaka

(10) Patent No.: US 12,482,672 B2
(45) Date of Patent: Nov. 25, 2025

(54) GAS HEATING APPARATUS, SEMICONDUCTOR MANUFACTURING APPARATUS, HEATING ELEMENT, AND SEMICONDUCTOR MANUFACTURING METHOD

(71) Applicant: Mitsubishi Electric Corporation, Tokyo (JP)

(72) Inventor: Hiroshi Tanaka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 308 days.

(21) Appl. No.: 17/658,469

(22) Filed: Apr. 8, 2022

(65) Prior Publication Data

US 2022/0406622 A1 Dec. 22, 2022

(30) Foreign Application Priority Data

Jun. 22, 2021 (JP) .................................. 2021-103142

(51) Int. Cl.
  *H01L 21/67* (2006.01)
  *F24H 3/04* (2022.01)
  (Continued)

(52) U.S. Cl.
  CPC ..... *H01L 21/67023* (2013.01); *F24H 3/0405* (2013.01); *H01L 21/30604* (2013.01); *H05B 6/108* (2013.01); *F24H 2250/08* (2013.01)

(58) Field of Classification Search
  CPC ......... H01L 21/67023; H01L 21/30604; H01L 21/67017; H01L 21/67103;
  (Continued)

(56) References Cited

U.S. PATENT DOCUMENTS 6,135,053 A * 10/2000 Okamura .......... C23C 16/45578
  118/723 E
6,299,683 B1 * 10/2001 Rupp .................... C23C 16/455
  117/88
(Continued)

FOREIGN PATENT DOCUMENTS

CN  1949086 A  4/2007
CN  111092029 A  5/2020
(Continued)

OTHER PUBLICATIONS

An Office Action; "Notice of Reasons for Refusal," mailed by the Japanese Patent Office on Apr. 23, 2024, which corresponds to Japanese Patent Application No. 2021-103142 and is related to U.S. Appl. No. 17/658,469; with English language translation.
(Continued)

*Primary Examiner* — Rudy Zervigon
(74) *Attorney, Agent, or Firm* — Studebaker Brackett PLLC

(57) ABSTRACT

A gas heating apparatus includes a heating element having a flat plate shape, a heat-resistant enclosure in which a space having a flat plate shape is provided, the heating element being disposed in the space with a gap provided between the heating element and the heat-resistant enclosure, a gas inlet joint connected to the heat-resistant enclosure to allow gas to flow into the space, a gas outlet joint connected to the heat-resistant enclosure to allow the gas that has passed through the space to flow out, and an induction coil disposed in parallel with the heating element on a lower surface of the heat-resistant enclosure, the induction coil inductively heating the heating element on the basis of electric power supplied.

19 Claims, 11 Drawing Sheets

(51) Int. Cl.
*H01L 21/306* (2006.01)
*H05B 6/10* (2006.01)

(58) Field of Classification Search
CPC ......... H01L 21/67109; H01L 21/68792; H01L 21/67098; H01L 21/67075; H01L 21/6715; F24H 3/0405; F24H 2250/08; H05B 6/108; H05B 6/06
USPC ....... 219/647, 651, 660, 675, 635, 636, 637; 118/724, 715; 156/345.37
See application file for complete search history.

(56) References Cited

U.S. PATENT DOCUMENTS

| | | | | |
|---|---|---|---|---|
| 6,440,220 | B1* | 8/2002 | Rudolph | C23C 16/4404 118/723 AN |
| 10,006,146 | B2* | 6/2018 | Park | H01L 21/67201 |
| 2004/0025786 | A1* | 2/2004 | Kontani | C23C 16/45578 118/715 |
| 2007/0087456 | A1 | 4/2007 | Hashizume | |
| 2009/0266911 | A1* | 10/2009 | Kim | C23C 16/45565 239/265.11 |
| 2010/0307417 | A1 | 12/2010 | Kojima et al. | |
| 2012/0180727 | A1* | 7/2012 | Hasegawa | C23C 16/45576 118/730 |
| 2013/0133579 | A1* | 5/2013 | Fang | C23C 16/4557 118/724 |
| 2014/0000519 | A1* | 1/2014 | Lee | H01L 21/67109 118/712 |
| 2018/0308741 | A1 | 10/2018 | Breingan et al. | |
| 2020/0135448 | A1 | 4/2020 | Tanaka | |

FOREIGN PATENT DOCUMENTS

| | | |
|---|---|---|
| DE | 10 2019 216 065 A1 | 4/2020 |
| JP | H07-35413 A | 2/1995 |
| JP | 2000-048943 A | 2/2000 |
| JP | 2005-274115 A | 10/2005 |
| JP | 2007-134689 A | 5/2007 |
| JP | 2010-050143 A | 3/2010 |
| JP | 2020-068275 A | 4/2020 |

OTHER PUBLICATIONS

An Office Action issued by the German Patent and Trade Mark Office on May 24, 2023, which corresponds to German Patent Application No. 102022114074.1 and is related to U.S. Appl. No. 17/658,469; with English language translation.

An Office Action issued by the State Intellectual Property Office of the People's Republic of China on May 11, 2024, which corresponds to Chinese Patent Application No. CN 202210713729.8.

"Notice of Reasons for Refusal" Office Action issued in JP 2021-103142; mailed by the Japanese Patent Office on Sep. 24, 2024.

* cited by examiner

GAS HEATING APPARATUS, SEMICONDUCTOR MANUFACTURING APPARATUS, HEATING ELEMENT, AND SEMICONDUCTOR MANUFACTURING METHOD

BACKGROUND OF THE INVENTION

Field of the Invention

The present disclosure relates to a gas heating apparatus, a semiconductor manufacturing apparatus, a heating element, and a semiconductor manufacturing method.

Description of the Background Art

In a semiconductor manufacturing process, after a pattern of organic material is formed by lithography using a resist, etching is performed on an oxide film and a metal material by dry etching using several types of gas energized through application of a high-frequency output.

Thereafter, in order to remove the resist, a chemical liquid is used to dissolve the resist. In a conventional general semiconductor manufacturing apparatus, a chemical liquid process is performed by discharging a chemical liquid at a predetermined flow rate while rotating a semiconductor wafer at a predetermined rotation speed and causing a chemical liquid nozzle to perform a scan at a predetermined speed so as to cause the chemical liquid to uniformly spread all over a processing surface of the semiconductor wafer. In order to ensure sufficient in-plane uniformity in the chemical liquid process, it is necessary to supply gas heated to a predetermined temperature to the semiconductor wafer.

A gas heating apparatus may be used in a method for heating the gas to the predetermined temperature. For example, in the technique disclosed in Japanese Patent Application Laid-Open No. 2000-48943, a plurality of flat heating elements having different sizes are stacked on top of each other in a cylindrical heating enclosure, and an induced magnetic field is generated by an induction coil wound into a cylindrical shape to heat the plurality of flat heating elements.

In the technique disclosed in Japanese Patent Application Laid-Open No. 2000-48943, the density of magnetic field lines of the induced magnetic field generated by the induction coil thus wound becomes higher and curved more sharply as it is closer to the induction coil, so that it is not easy to set the plurality of heating elements stacked on top of each other to the same temperature. Further, the plurality of flat heating elements are stacked on top of each other in the cylindrical heating enclosure, so that a region through which the gas passes becomes wider at a position away from the heating elements such as a curved surface portion of the heating enclosure. This makes it difficult to efficiently heat or cool the gas.

As described above, in the technique disclosed in Japanese Patent Application Laid-Open No. 2000-48943, it is necessary to further increase the thermal capacity of the heating elements or to further increase the area of the heating elements in order to stably obtain gas having a desired temperature, which deteriorates response when heating or cooling the gas.

SUMMARY

An object of the present disclosure is to provide a technique that allows an improvement in response when heating or cooling gas.

A gas heating apparatus according to the present disclosure includes a heating element having a flat plate shape, a heat-resistant enclosure, a gas inlet joint, a gas outlet joint, and an induction coil. In the heat-resistant enclosure, a space having a flat plate shape is provided, and the heating element is disposed in the space with a gap provided between the heating element and the heat-resistant enclosure. The gas inlet joint is connected to the heat-resistant enclosure to allow gas to flow into the space. The gas outlet joint is connected to the heat-resistant enclosure to allow the gas that has passed through the space to flow out. The induction coil is disposed in parallel with the heating element on a lower surface of the heat-resistant enclosure and inductively heats the heating element on the basis of electric power supplied.

The induction coil is disposed in parallel with the heating element on the lower surface of the heat-resistant enclosure, so that the magnetic flux distribution of the induction coil becomes uniform and thus optimized. This allows the temperature of the heating element during heating or cooling to be uniform.

Furthermore, the heating element having a flat plate shape is disposed, with a gap provided around the heating element, in the space having a flat plate shape as with the heating element, so that the gap around the heating element becomes uniform. This allows the gas passing through the space of the heat-resistant enclosure to be uniformly heated or cooled. As described above, gas having a desired temperature can be stably obtained without increasing the thermal capacity of the heating element or increasing the area of the heating element, so that it is possible to improve the response when heating or cooling the gas.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

First Preferred Embodiment

Figure 1:
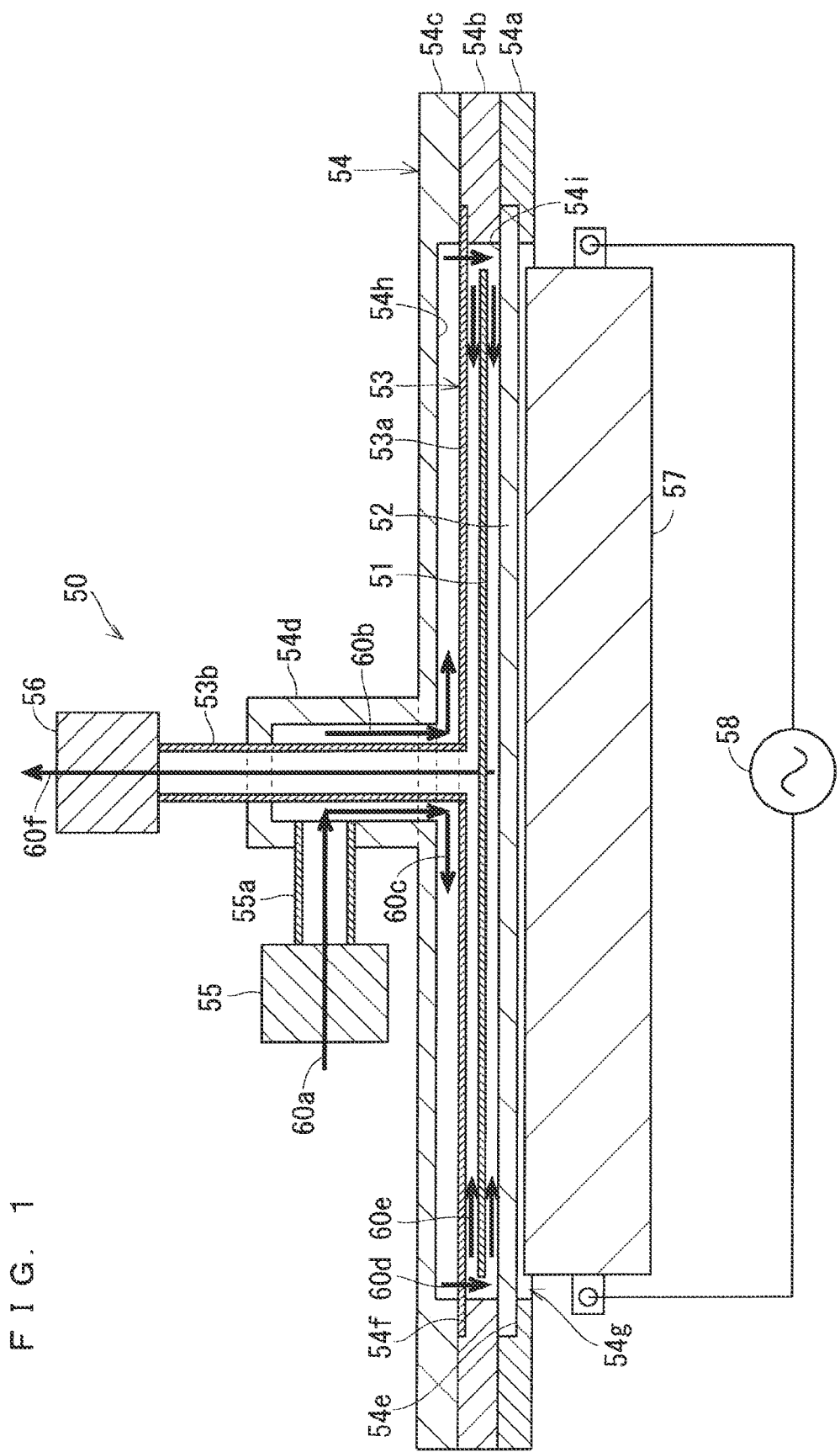
FIG. 1 is a cross-sectional view of a gas heating part of a gas heating apparatus according to a first preferred embodiment.

A description will be given of a first preferred embodiment with reference to the drawings. FIG. 1 is a cross-sectional view of a gas heating part 50 of a gas heating apparatus 11a (see FIG. 5) according to the first preferred embodiment.

As shown in FIG. 1, the gas heating part 50 of the gas heating apparatus 11a (see FIG. 5) includes a heating element 51 having a flat plate shape, a guide plate 52 having a flat plate shape, a straightening plate 53, a heat-resistant enclosure 54, a gas inlet joint 55, a gas outlet joint 56, an induction coil 57, and a power supply 58.

The heat-resistant enclosure 54 includes a heat-resistant enclosure guide plate holder 54a, heat-resistant enclosure straightening plate holder 54b, and heat-resistant enclosure base 54c. The heat-resistant enclosure guide plate holder 54a is formed into, for example, an annular shape in a top view. An annular groove 54e is formed along an inner edge portion of an upper surface of the heat-resistant enclosure guide plate holder 54a to accommodate an outer edge portion of the guide plate 52. The heat-resistant enclosure straightening plate holder 54b is formed into, for example, an annular shape in a top view and is disposed on the upper surface of the heat-resistant enclosure guide plate holder 54a. An inner edge portion of a lower surface of the heat-resistant enclosure straightening plate holder 54b is in contact with an outer edge portion of an upper surface of the guide plate 52, and the heat-resistant enclosure straightening plate holder 54b and the heat-resistant enclosure guide plate holder 54a hold the guide plate 52.

An annular groove 54f is formed along an inner edge portion of an upper surface of the heat-resistant enclosure straightening plate holder 54b to accommodate an outer edge portion of a straightening plate portion 53a serving as a part of the straightening plate 53. The heat-resistant enclosure base 54c is disposed on the upper surface of the heat-resistant enclosure straightening plate holder 54b. An opening 54g is formed through inner peripheral sides of the heat-resistant enclosure straightening plate holder 54b and the heat-resistant enclosure guide plate holder 54a. A recessed portion 54h recessed upward is formed at a position facing the opening 54g on a lower surface of the heat-resistant enclosure base 54c. A peripheral edge portion of the recessed portion 54h on the lower surface of the heat-resistant enclosure base 54c is in contact with an outer edge portion of an upper surface of the straightening plate portion 53a, and the heat-resistant enclosure base 54c and the heat-resistant enclosure straightening plate holder 54b hold the straightening plate portion 53a. A bulging portion 54d bulging upward is formed at a center portion of an upper surface of the heat-resistant enclosure base 54c.

A space 54i formed into a flat plate shape is provided between the straightening plate portion 53a and the guide plate 52 in the heat-resistant enclosure 54, and the heating element 51 is disposed in the space 54i with a gap provided around the heating element 51.

The straightening plate 53 includes the straightening plate portion 53a and a straightening plate conduit portion 53b. The straightening plate conduit portion 53b is provided to stand at a center portion of the straightening plate portion 53a and extends upward beyond an upper end of the bulging portion 54d. The gas outlet joint 56 is connected to an inside of the straightening plate conduit portion 53b.

The gas inlet joint 55 is connected to an inside of the bulging portion 54d with a conduit portion 55a interposed between the gas inlet joint 55 and the bulging portion 54d. Gas introduced from the gas inlet joint 55 passes through the conduit portion 55a, a gap between the bulging portion 54d and the straightening plate conduit portion 53b, a gap between the recessed portion 54h and the straightening plate portion 53a, gas dispersion holes 53c (see FIG. 4) of the straightening plate portion 53a, a gap around the heating element 51 in the space 54i, a gas outlet port 51a1 (see FIG. 2), and the straightening plate conduit portion 53b and flows out from the gas outlet joint 56. Herein, as shown in FIG. 1, the gas flow is denoted as gas flow 60a, 60b, 60c, 60d, 60e, 60f. Note that the gap around the heating element 51 in the space 54i refers to a gap between the heating element 51 and the guide plate 52 and a gap between the heating element 51 and the straightening plate 53.

The induction coil 57 is disposed in parallel with the heating element 51 on a lower surface of the heat-resistant enclosure 54. Specifically, the induction coil 57 is disposed in parallel with the heating element 51 under a lower surface of the guide plate 52 held by the heat-resistant enclosure guide plate holder 54a. When appropriate electric power is supplied from the power supply 58 to the induction coil 57, the heating element 51 is inductively heated by an appropriate induced current generated in the heating element 51. The heating element 51 inductively heated heats the gas indicated by the gas flow 60e.

The guide plate 52 is made of a non-metal material such as quartz glass so as not to block the induced magnetic field. The straightening plate portion 53a of the straightening plate 53 is made of a metal material such as aluminum having high thermal conductivity so as to efficiently transfer heat radiated from the heating element 51 to the gas indicated by the gas flow 60c, 60d, 60e. The straightening plate conduit portion 53b of the straightening plate 53 is also made of a metal material so as to be heated by conducted heat. The heat-resistant enclosure guide plate holder 54a, the heat-resistant enclosure straightening plate holder 54b, and the heat-resistant enclosure base 54c that constitute the heat-resistant enclosure 54 are each made of a metal material so as to ensure pressure tightness.

The gap between the heating element 51 and the guide plate 52 and the gap between the heating element 51 and the straightening plate 53 are set as small as possible within a range where the gas flow rate can be secured to allow the gas to be uniformly heated, so that it is possible to improve the response when heating or cooling the gas.

Figure 2:
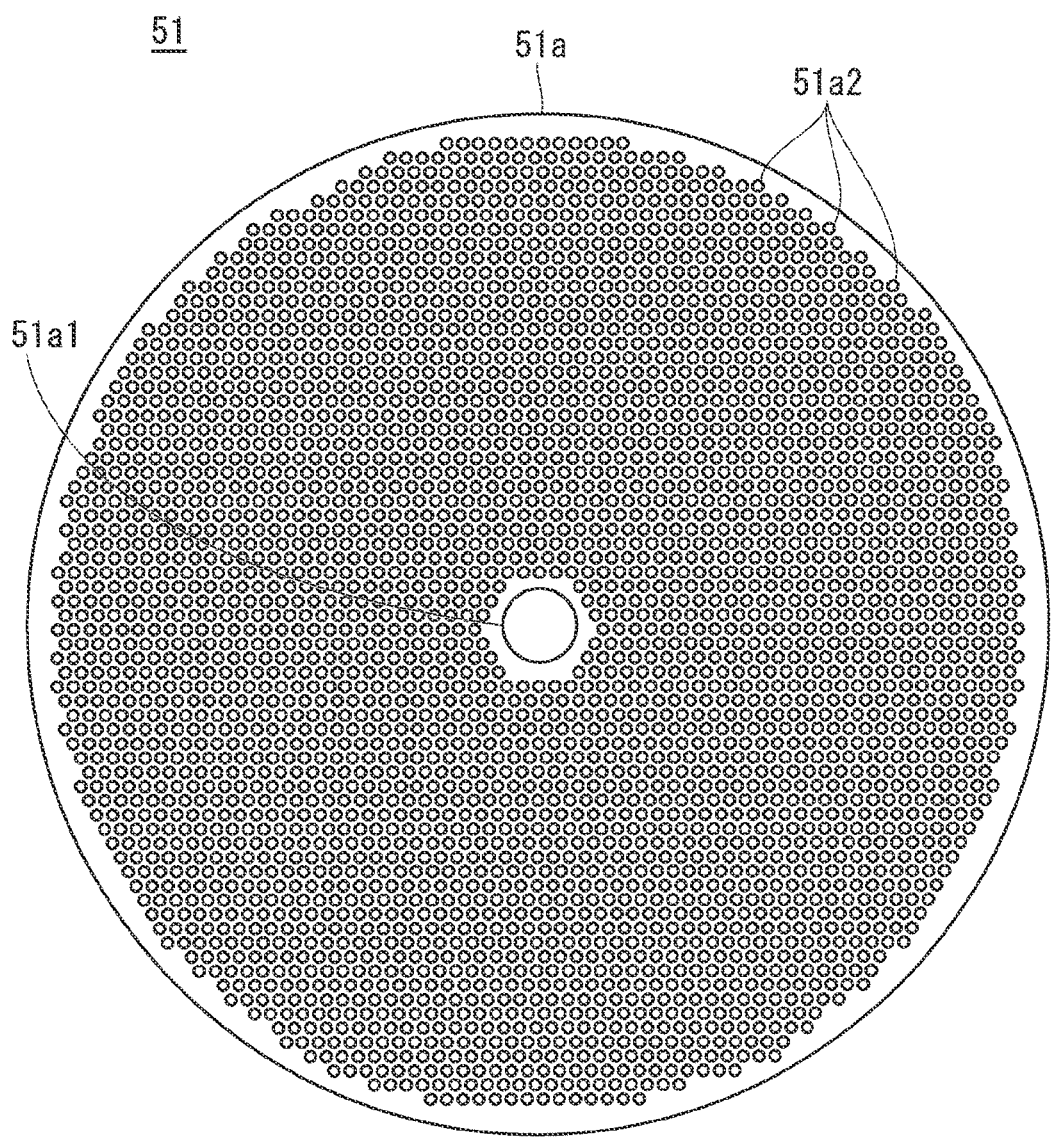
FIG. 2 is a schematic top view of an example of a heating element.
Figure 3:
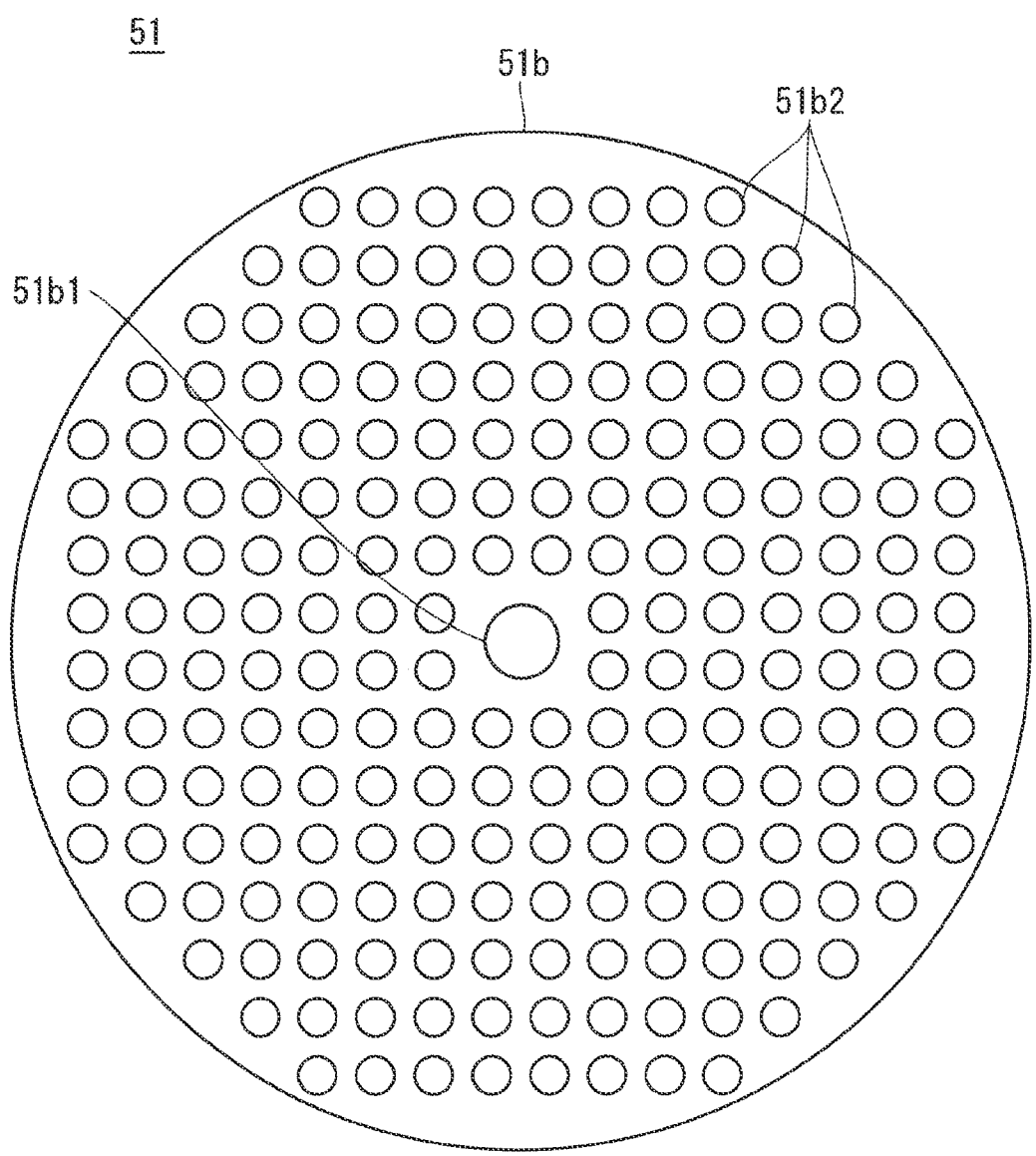
FIG. 3 is a schematic top view of another example of the heating element.

Next, a description will be given of the details of the heating element 51. FIG. 2 is a schematic top view of an example of the heating element 51. FIG. 3 is a schematic top view of another example of the heating element 51. FIGS. 2 and 3 shows examples obtained as a result of redesigning the shape of the heating element 51 so as to efficiently agitate the gas nearby the heating element 51 having a flat plate shape.

As shown in FIG. 2, the heating element 51 is a porous heating element, and includes a disk portion 51a, a gas outlet port 51a1, and a large number of through holes 51a2. The disk portion 51a has an upper surface serving as a first main surface and a lower surface serving as a second main surface opposed to the upper surface. The gas outlet port 51a1 passing through from the upper surface to the lower surface is provided at a center portion of the disk portion 51a, and the large number of through holes 51a2 passing through from the upper surface to the lower surface are provided in the disk portion 51a excluding a peripheral edge portion and the center portion.

As shown in FIG. 3, the heating element 51 is an uneven heating element and includes a disk portion 51b, a gas outlet port 51b1, and a large number of irregularities. The disk portion 51b has an upper surface serving as the first main surface and a lower surface serving as the second main surface opposed to the upper surface. The gas outlet port 51b1 passing through from the upper surface to the lower surface is provided at a center portion of the disk portion 51b, and the large number of irregularities are provided over the upper surface and the lower surface of the disk portion 51b excluding a peripheral edge portion and the center portion. Specifically, irregularities on the upper surface of the disk portion 51b are composed of the upper surface of the disk portion 51b and protrusions 51b2 protruding upward from the upper surface of the disk portion 51b, and irregularities on the lower surface of the disk portion 51b are composed of the lower surface of the disk portion 51b and protrusions 51b2 protruding downward from the lower surface of the disk portion 51b.

In the example shown in FIG. 2, gas passing along the upper surface of the heating element 51 having a flat plate shape and gas passing along the lower surface of the heating element 51 indicated by the gas flow 60e shown in FIG. 1 pass through the through holes 51a2 to come into contact with each other to generate a turbulent flow, thereby allowing nearby gas to be agitated and allowing the temperature to become further uniform. Further, in the example shown in FIG. 3, gas passing along the upper surface of the heating element 51 having a flat plate shape and gas passing along the lower surface of the heating element 51 indicated by the gas flow 60e shown in FIG. 1 pass through the large number of irregularities to generate a turbulent flow, thereby allowing nearby gas to be agitated and allowing the temperature to become further uniform.

Figure 4:
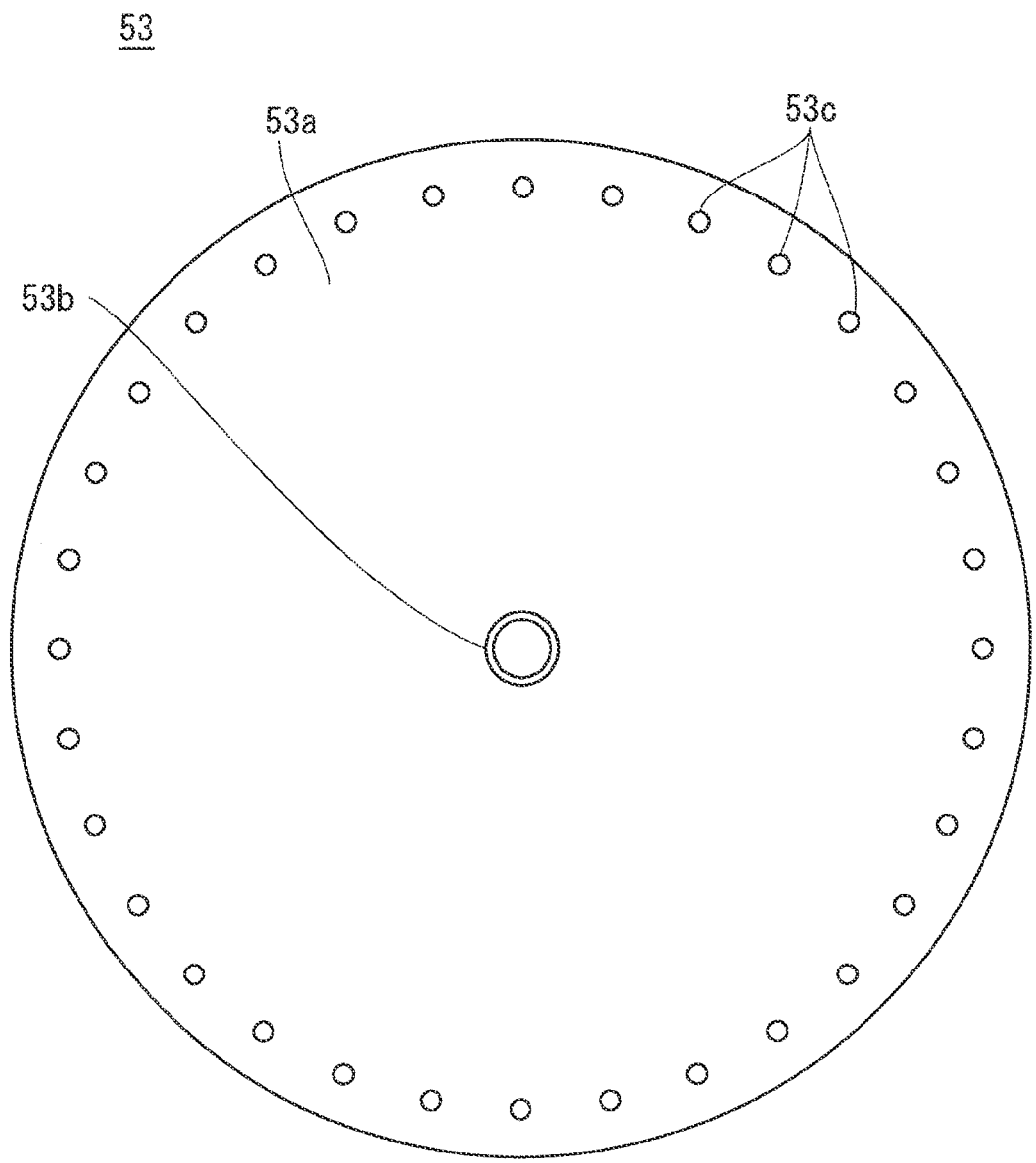
FIG. 4 is a schematic top view of an example of a straightening plate.

Next, a description will be given of the details of the straightening plate 53. FIG. 4 is a schematic top view of an example of the straightening plate 53.

As shown in FIG. 4, the straightening plate 53 includes the plurality of gas dispersion holes 53c in addition to the straightening plate portion 53a and the straightening plate conduit portion 53b. The plurality of gas dispersion holes 53c are provided in a peripheral edge portion of the straightening plate portion 53a and pass through from the upper surface to the lower surface of the straightening plate portion 53a. The gas flow 60c passing along the upper surface of the straightening plate 53 shown in FIG. 1 passes through the gas dispersion holes 53c to become the gas flow 60d, and further passes along the upper surface and the lower surface of the heating element 51 from the end portion of the heating element 51 to become the gas flow 60e flowing toward the center portion of the heating element 51.

Figure 5:
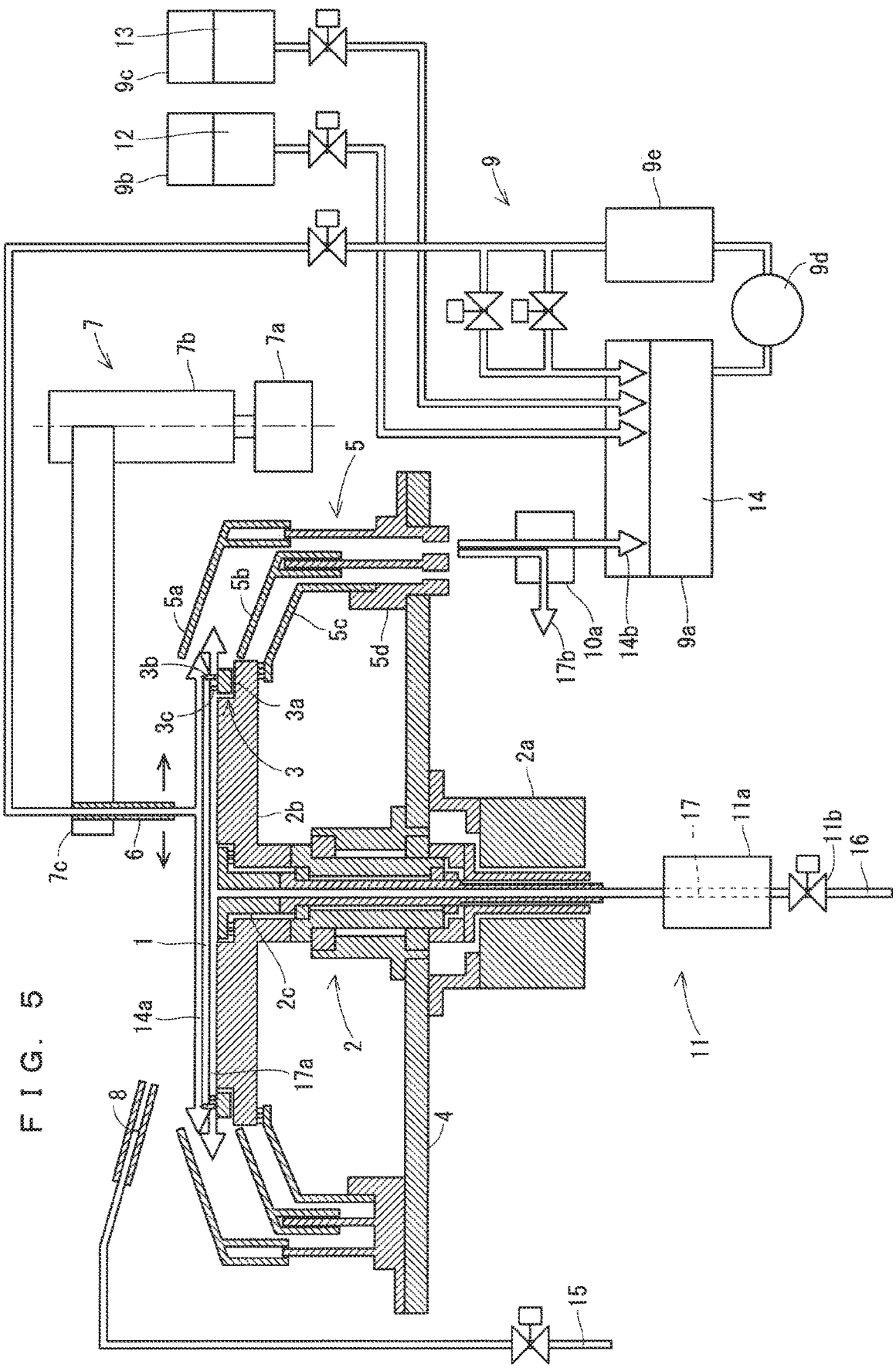
FIG. 5 is a cross-sectional view showing a chemical liquid process in a processing chamber of a semiconductor manufacturing apparatus according to the first preferred embodiment.

Next, a description will be given of a semiconductor manufacturing apparatus according to the first preferred embodiment. FIG. 5 is a cross-sectional view showing a chemical liquid process in a processing chamber of the semiconductor manufacturing apparatus according to the first preferred embodiment.

As shown in FIG. 5, the semiconductor manufacturing apparatus includes a stage rotation mechanism 2, a chuck opening and closing mechanism 3, a platen 4, a cup lift mechanism 5, a chemical liquid nozzle 6, a chemical liquid nozzle scan mechanism 7, a water nozzle 8, a chemical liquid temperature control circulation discharge mechanism 9, a first gas-liquid separator 10a, and a lower surface gas temperature control discharge mechanism 11.

The stage rotation mechanism 2 includes a stage rotation motor 2a, a chuck stage 2b, and a lower surface gas nozzle 2c whose discharge port is positioned in alignment with a center portion of a semiconductor wafer 1. The chuck stage 2b holds the semiconductor wafer 1 using an end portion of the chuck stage 2b. The stage rotation motor 2a rotates the chuck stage 2b. The lower surface gas nozzle 2c supplies gas to a surface opposed to a processing surface of the semiconductor wafer 1.

The chuck opening and closing mechanism 3 includes a chuck pin base 3a, a chuck pin 3b, and a support pin 3c. The cup lift mechanism 5 includes a first cup 5a, a second cup 5b, a cover 5c, and a cup base 5d.

The chemical liquid nozzle 6 discharges a chemical liquid 14a to the processing surface of the semiconductor wafer 1. The chemical liquid nozzle scan mechanism 7 includes a scan motor 7a, a scan shaft 7b, and a scan arm 7c, and causes the chemical liquid nozzle 6 to perform a scan on the processing surface of the semiconductor wafer 1. The chemical liquid temperature control circulation discharge mechanism 9 includes a chemical liquid circulation tank 9a, a first stock solution tank 9b, a second stock solution tank 9c, a chemical liquid circulation pump 9d, and a chemical liquid temperature controller 9e.

The lower surface gas temperature control discharge mechanism 11 includes the gas heating apparatus 11a and an on-off valve 11b. The on-off valve 11b is disposed adjacent to an inlet of the gas heating apparatus 11a. The gas flowing out from the gas heating apparatus 11a is supplied to the lower surface gas nozzle 2c. The lower surface gas nozzle 2c is a nozzle for supplying the gas flowing out from the gas heating apparatus 11a to the semiconductor wafer 1 during the execution of the process on the processing surface of the semiconductor wafer 1. Herein, the process that is associated with the lower surface gas nozzle 2c and is performed on the processing surface of the semiconductor wafer 1 includes a chemical liquid process, a water washing process, and a drying process performed in the processing chamber.

Controlling electric power supplied to the induction coil 57 of the gas heating apparatus 11a controls a temperature of the gas flowing out from the gas heating apparatus 11a. Specifically, the gas heating apparatus 11a is controlled on the basis of the electric power supplied to the induction coil 57 to heat or cool the gas to a temperature set for each step of a recipe corresponding to the process performed on the processing surface of the semiconductor wafer 1.

With the electric power supplied to the induction coil 57, opening the on-off valve 11b changes ambient temperature gas 16 to temperature-controlled by the gas heating apparatus 11a to become temperature-controlled gas 17 and supplied to the lower surface gas nozzle 2c. On the other hand, with no electric power supplied to the induction coil 57, opening the on-off valve 11b causes the ambient temperature gas 16 to pass through the gas heating apparatus 11a without being temperature-controlled by the gas heating apparatus 11a and supplied to the lower surface gas nozzle 2c as it is.

Note that the processing surface of the semiconductor wafer 1 is an upper surface of the semiconductor wafer 1.

The surface opposed to the processing surface of the semiconductor wafer 1 is an opposite surface opposed to the processing surface of the semiconductor wafer 1, and more specifically, a lower surface of the semiconductor wafer 1.

Figure 6:
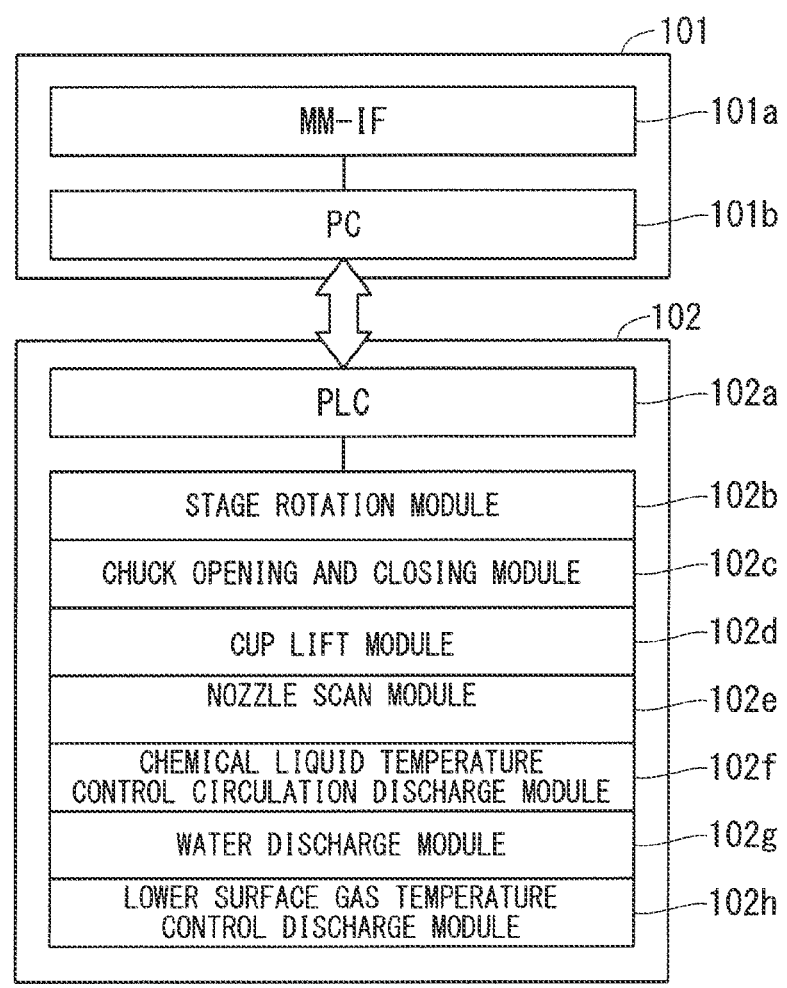
FIG. 6 is a schematic diagram showing a control function of the processing chamber of the semiconductor manufacturing apparatus according to the first preferred embodiment.

FIG. 6 is a schematic diagram showing a control function of the processing chamber of the semiconductor manufacturing apparatus according to the first preferred embodiment. As shown in FIG. 6, an operation PC 101 includes a man machine interface (MM-IF) 101a such as a touch panel display and a personal computer (PC) 101b. A control PLC 102 includes a programmable logic controller (PLC) 102a, a stage rotation module 102b that controls the stage rotation mechanism 2, a chuck opening and closing module 102c that controls the chuck opening and closing mechanism 3, a cup lift module 102d that controls the cup lift mechanism 5, a nozzle scan module 102e that controls the chemical liquid nozzle scan mechanism 7, a chemical liquid temperature control circulation discharge module 102f that controls the chemical liquid temperature control circulation discharge mechanism 9, a water discharge module 102g that controls a discharge of water 15, and a lower surface gas temperature control discharge module 102h that controls the lower surface gas temperature control discharge mechanism 11.

An operator sets a carrier (not shown) containing the semiconductor wafer 1 in a load port (not shown), selects a recipe pre-registered in the PC 101b on the MM-IF 101a, and inputs a process start. The PC 101b passes a processing parameter specified in the recipe to the PLC 102a to start a series of control operations of the PLC 102a. The PLC 102a controls a transfer robot (not shown), the processing chamber, and the like, causes the transfer robot to map wafer loading slots in the carrier and to transfer the semiconductor wafer 1 between the carrier and the processing chamber, and performs a series of processes on the semiconductor wafer 1 in the processing chamber.

Next, a description will be given of preparation of the chemical liquid 14 in the chemical liquid temperature control circulation discharge mechanism 9. In this example, a desired chemical liquid 14 is prepared from two stock solutions. A specified amount of first stock solution 12 is supplied from the first stock solution tank 9b to the chemical liquid circulation tank 9a, and a specified amount of second stock solution 13 is supplied from the second stock solution tank 9c to the chemical liquid circulation tank 9a. The chemical liquid circulation pump 9d is actuated to circulate the chemical liquid 14, and the chemical liquid temperature controller 9e controls a temperature of the chemical liquid 14 to a predetermined temperature while the chemical liquid 14 keeps being circulated. When a circulation flow rate and the temperature of the chemical liquid 14 fall within predetermined ranges, the preparation of the chemical liquid 14 is completed. Note that an operation of additionally supplying the first stock solution 12 and the second stock solution 13 to compensate for a decrease in liquid components caused by volatilization, decomposition and reaction, and a decrease in liquid volume due to the use of the chemical liquid 14 is generally performed.

Next, a description will be given of an operation of the processing chamber. Rotating the chuck pin base 3a of the chuck opening and closing mechanism 3 to open and close the chuck pin 3b with the ambient temperature gas 16 passing through the gas heating apparatus 11a supplied from the lower surface gas nozzle 2c allows the semiconductor wafer 1 to be placed on the chuck stage 2b of the stage rotation mechanism 2. The ambient temperature gas 16 serves to hold the semiconductor wafer 1 by the Bernoulli effect. Causing the stage rotation motor 2a to rotate the chuck stage 2b allows the semiconductor wafer 1 held by the chuck pin 3b to rotate. The chemical liquid nozzle 6 is attached to the chemical liquid nozzle scan mechanism 7, and the scan motor 7a oscillates to allow the chemical liquid nozzle 6 to perform a scan on the upper surface of the semiconductor wafer 1 via the scan shaft 7b and the scan arm 7c. The chemical liquid process is performed by discharging the chemical liquid 14 at a predetermined flow rate while rotating the semiconductor wafer 1 at a predetermined rotation speed and causing the chemical liquid nozzle 6 to perform a scan at a predetermined speed so as to cause the chemical liquid 14a on the upper surface of the semiconductor wafer 1 to uniformly spread all over the upper surface of the semiconductor wafer 1.

Although the rotation of the semiconductor wafer 1 causes the chemical liquid 14a on the upper surface of the semiconductor wafer 1 to flow out from an end portion of the semiconductor wafer 1, with the first cup 5a of the cup lift mechanism 5 disposed to surround a periphery of the chuck stage 2b lifted, the chemical liquid 14a becomes a reclaimed chemical liquid 14b and returns to the chemical liquid circulation tank 9a through the first gas-liquid separator 10a.

During the execution of the chemical liquid process, in order to prevent the chemical liquid 14a on the upper surface of the semiconductor wafer 1 from flowing along the end portion of the semiconductor wafer 1 to a lower surface due to surface tension and further to suppress a temperature change in an area around the center portion of the semiconductor wafer 1, the temperature-controlled gas 17 whose temperature has been controlled by the gas heating apparatus 11a to a predetermined temperature appropriate to the chemical liquid temperature is supplied from the lower surface gas nozzle 2c positioned in alignment with the center portion of the chuck stage 2b. The temperature-controlled gas 17 serves to hold the semiconductor wafer 1 by the Bernoulli effect. This makes it possible to ensure sufficient in-plane uniformity in the chemical liquid process. Temperature-controlled gas 17a on the lower surface of the semiconductor wafer 1 is exhausted by the first cup 5a together with an atmosphere on the upper surface of the semiconductor wafer 1 and then becomes temperature-controlled gas 17b to be released through the first gas-liquid separator 10a.

When the chemical liquid process is completed, the discharge of the chemical liquid 14 is stopped, the chemical liquid nozzle scan mechanism 7 is returned to a standby position, the second cup 5b is lifted, and the water washing process is started.

Figure 7:
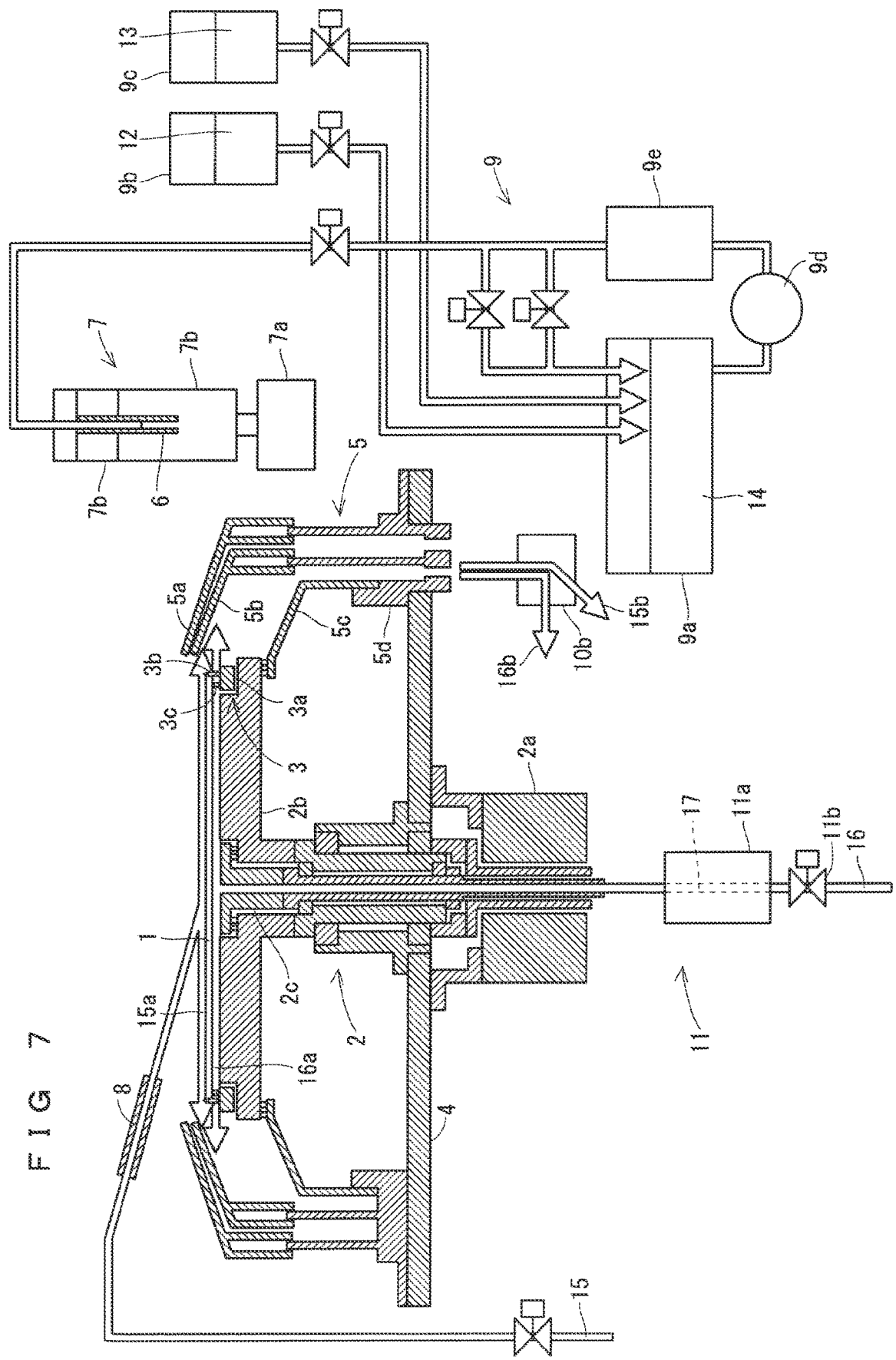
FIG. 7 is a cross-sectional view showing a water washing process in the processing chamber of the semiconductor manufacturing apparatus according to the first preferred embodiment.

FIG. 7 is a cross-sectional view showing the water washing process in the processing chamber. As shown in FIG. 7, the water washing process is performed by discharging the water 15 from the water nozzle 8 to the center portion of the semiconductor wafer 1 at a predetermined flow rate while rotating the semiconductor wafer 1 at a predetermined rotation speed so as to cause the water 15 to uniformly spread all over the upper surface of the semiconductor wafer 1.

During the execution of the water washing process, in order to prevent the water 15a on the upper surface of the semiconductor wafer 1 from flowing along the end portion of the semiconductor wafer 1 to the lower surface due to surface tension, the ambient temperature gas 16 passing through the gas heating apparatus 11a is supplied from the lower surface gas nozzle 2c positioned in alignment with the center portion of the chuck stage 2b. The ambient temperature gas 16 serves to hold the semiconductor wafer 1 by the Bernoulli effect.

Note that the amount of heat conducted from the semiconductor wafer 1 to water 15a is large during the execution of the water washing process, so that high-temperature gas during the conversion of the temperature-controlled gas 17 to the ambient temperature gas 16 is acceptable in most cases, and there is no problem even when the temperature-controlled gas 17 remains as it is in consideration of the next drying process. Similarly, the temperature-controlled gas 17 serves to hold the semiconductor wafer 1 by the Bernoulli effect.

Ambient temperature gas 16a on the lower surface of the semiconductor wafer 1 is exhausted by the second cup 5b together with the atmosphere on the upper surface of the semiconductor wafer 1 and then becomes ambient temperature gas 16b to be released through a second gas-liquid separator 10b. At this time, water 15b is drained from the second gas-liquid separator 10b. When the water washing process is completed, the discharge of the water 15 is stopped, and the drying process is started.

Figure 8:
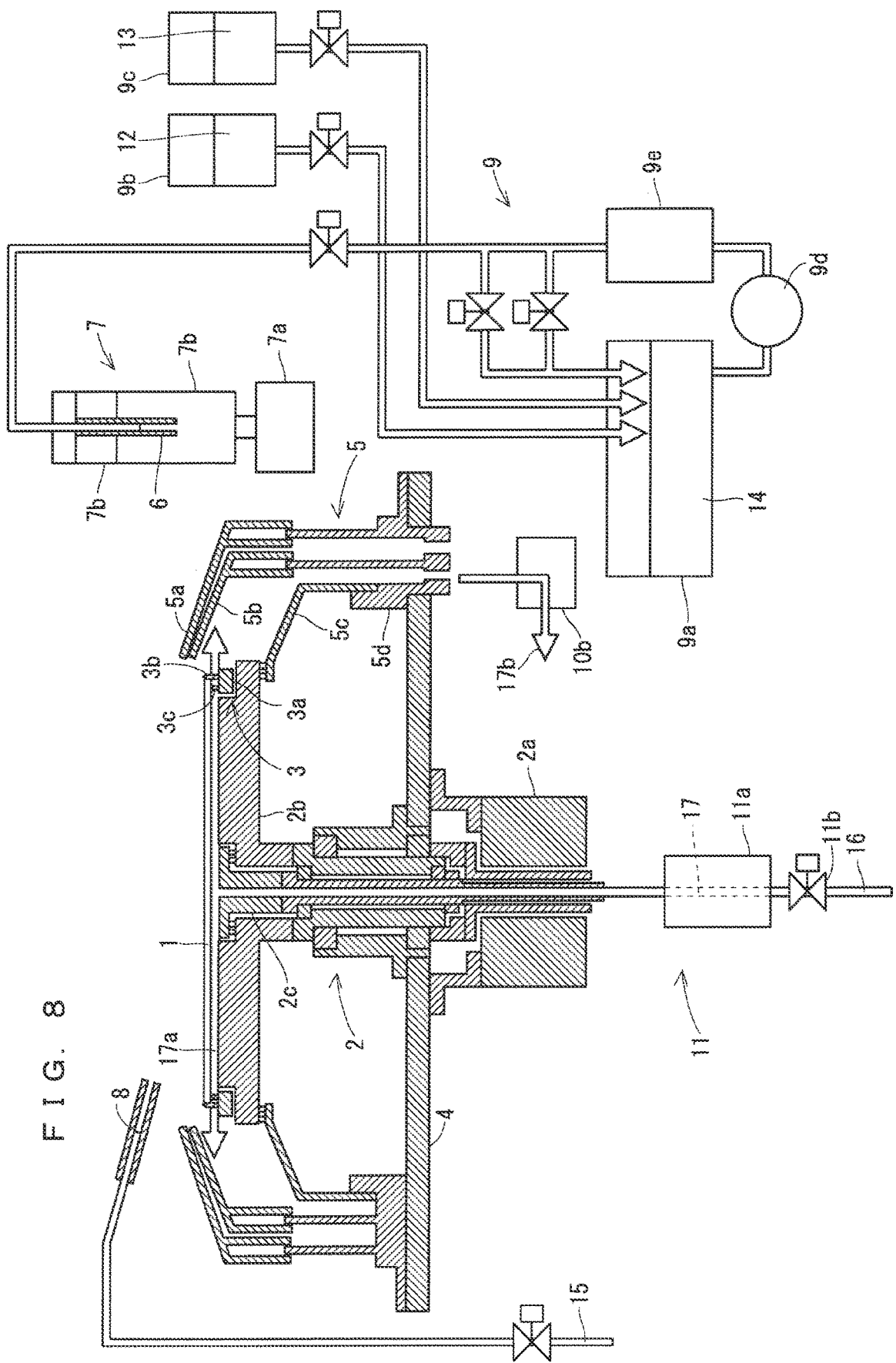
FIG. 8 is a cross-sectional view showing a drying process in the processing chamber of the semiconductor manufacturing apparatus according to the first preferred embodiment.

FIG. 8 is a cross-sectional view showing the drying process in the processing chamber. As shown in FIG. 8, rotating the semiconductor wafer 1 at a predetermined rotation speed causes the semiconductor wafer 1 to be spin-dried.

During the execution of the drying process, in order to prevent the water 15a (see FIG. 7) on the upper surface of the semiconductor wafer 1 from flowing along the end portion of the semiconductor wafer 1 to the lower surface due to surface tension and droplets splashing off the second cup 5b from moving to the lower surface and to further accelerate the drying of the semiconductor wafer 1, the temperature-controlled gas 17 whose temperature has been controlled by the gas heating apparatus 11a to a predetermined temperature suitable for the drying is supplied from the lower surface gas nozzle 2c positioned in alignment with the center portion of the chuck stage 2b. The temperature-controlled gas 17 serves to hold the semiconductor wafer 1 by the Bernoulli effect.

The supply of the temperature-controlled gas 17 whose temperature is higher than the ambient temperature heats the semiconductor wafer 1 to allow a drying time to be shortened.

The temperature-controlled gas 17a on the lower surface of the semiconductor wafer 1 is exhausted by the second cup 5b together with the atmosphere on the upper surface of the semiconductor wafer 1 and then becomes the temperature-controlled gas 17b to be released through the second gas-liquid separator 10b.

Figure 9:
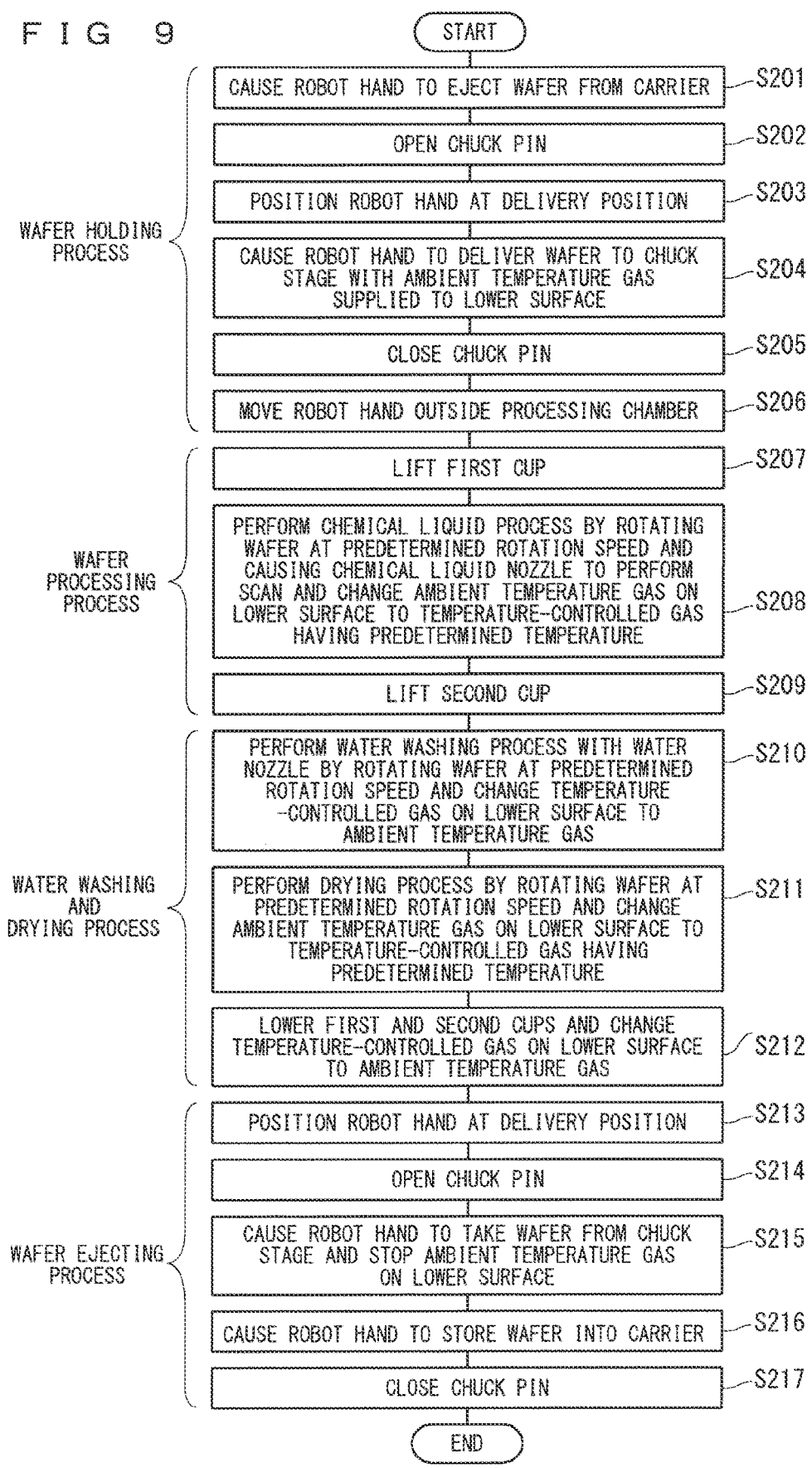
FIG. 9 is a flowchart showing processes to be performed in the semiconductor manufacturing apparatus according to the first preferred embodiment.

FIG. 9 is a flowchart showing processes to be performed in the semiconductor manufacturing apparatus according to the first preferred embodiment.

As shown in FIG. 9, a wafer holding process includes steps S201 to S206, a wafer processing process includes steps S207 to S209, a water washing and drying process includes steps S210 to S212, and a wafer ejecting process includes steps S213 to S217.

The PLC 102a causes a robot hand of the transfer robot to eject, from the carrier, the semiconductor wafer 1 stored in the carrier in step S201, and rotates the chuck pin base 3a to open the chuck pin 3b in step S202.

The PLC 102a positions the robot hand at a delivery position over the chuck stage 2b in step S203, and causes the robot hand to deliver the semiconductor wafer 1 to the chuck stage 2b with the ambient temperature gas supplied to the lower surface of the semiconductor wafer 1 in step S204.

The PLC 102a rotates the chuck pin base 3a to close the chuck pin 3b in step S205, moves the robot hand outside the processing chamber in step S206, and lifts the first cup 5a in step S207.

The PLC 102a performs, in step S208, the chemical liquid process by discharging the chemical liquid 14 at the predetermined flow rate while rotating the semiconductor wafer 1 at the predetermined rotation speed and causing the chemical liquid nozzle 6 to perform a scan at the predetermined speed so as to cause the chemical liquid 14a on the upper surface of the semiconductor wafer 1 to uniformly spread all over the upper surface of the semiconductor wafer 1 as described above. During the execution of the chemical liquid process, in order to prevent the chemical liquid 14a on the upper surface of the semiconductor wafer 1 from flowing along the end portion of the semiconductor wafer 1 to the lower surface due to surface tension and further to suppress a temperature change in an area around the center portion of the semiconductor wafer 1, the temperature-controlled gas 17 whose temperature has been controlled by the gas heating apparatus 11a to a predetermined temperature appropriate to the chemical liquid temperature is supplied from the lower surface gas nozzle 2c positioned in alignment with the center portion of the chuck stage 2b.

The PLC 102a lifts the second cup 5b in step S209, and performs, in step S210, the water washing process by discharging the water 15 from the water nozzle 8 to the center portion of the semiconductor wafer 1 at the predetermined flow rate while rotating the semiconductor wafer 1 at the predetermined rotation speed so as to cause the water 15 to uniformly spread all over the upper surface of the semiconductor wafer 1 as described above. During the execution of the water washing process, in order to prevent the water on the upper surface of the semiconductor wafer 1 from flowing along the end portion of the semiconductor wafer 1 to the lower surface due to surface tension, the ambient temperature gas 16 passing through the gas heating apparatus 11a is supplied from the lower surface gas nozzle 2c positioned in alignment with the center portion of the chuck stage 2b.

Note that the amount of heat conducted from the semiconductor wafer 1 to the water 15a is large during the execution of the water washing process, so that high-temperature gas during the conversion of the temperature-controlled gas 17 to the ambient temperature gas 16 is acceptable in most cases, and there is no problem even when the temperature-controlled gas 17 remains as it is in consideration of the next drying process.

The PLC 102a rotates the semiconductor wafer 1 at the predetermined rotation speed to spin-dry the semiconductor wafer 1 in step S211. During the execution of the drying process, in order to prevent the water 15a on the upper surface of the semiconductor wafer 1 from flowing along the end portion of the semiconductor wafer 1 to the lower surface due to surface tension and droplets splashing off the second cup 5b from moving to the lower surface and to further accelerate the drying of the semiconductor wafer 1, the temperature-controlled gas 17 whose temperature has been controlled by the gas heating apparatus 11a to a predetermined temperature suitable for the drying is supplied from the lower surface gas nozzle 2c positioned in alignment with the center portion of the chuck stage 2b.

The PLC 102a lowers the first cup 5a and the second cup 5b and supplies the ambient temperature gas 16 passing through the gas heating apparatus 11a from the lower surface gas nozzle 2c positioned in alignment with the center portion of the chuck stage 2b in step S212, and positions the robot hand at the delivery position in step S213.

The PLC 102a rotates the chuck pin base 3a to open the chuck pin 3b in step S214, and causes the robot hand to take the semiconductor wafer 1 from the chuck stage 2b and stops the ambient temperature gas 16 being supplied from the lower surface gas nozzle 2c positioned in alignment with the center portion of the chuck stage 2b in step S215.

The PLC 102a causes the robot hand to store the semiconductor wafer 1 into the carrier in step S216, and rotates the chuck pin base 3a to close the chuck pin 3b in step S217.

In steps S204 to S215, the ambient temperature gas 16 or the temperature-controlled gas 17 is supplied to hold the semiconductor wafer 1 by the Bernoulli effect.

The response when heating gas is required to allow the ambient temperature gas 16 to be supplied as the temperature-controlled gas 17 during a period from the holding of the semiconductor wafer 1 to the start of the chemical liquid process, and there is no problem as long as the response is, for example, 20 seconds or less.

The response when cooling gas is required to lower the temperature of the semiconductor wafer 1 to a temperature that does not affect the transfer during a period from the drying of the semiconductor wafer 1 to the ejecting of the semiconductor wafer 1, and, for example, when the temperature that does not affect the transfer is 60° C., sufficient drying performance can be obtained even when the semiconductor wafer 1 is dried with temperature-controlled gas having 80° C. or lower in order to achieve a response of 30 seconds or less.

Note that, although the steps have been described roughly sequentially for the purpose of simplification, it is needless to say that segmented operation steps are practically in execution in parallel, and various inputs and outputs related to the operations are in execution.

Effect

As described above, in the gas heating apparatus 11a according to the first preferred embodiment, the induction coil 57 is disposed in parallel with the heating element 51 on the lower surface of the heat-resistant enclosure 54, so that the magnetic flux distribution of the induction coil 57 becomes uniform and optimized. This allows the temperature of the heating element 51 during heating or cooling to be uniform.

Furthermore, the heating element 51 having a flat plate shape is disposed, with a gap provided around the heating element 51, in the space 54i having a flat plate shape as with the heating element 51, so that the gap around the heating element 51 becomes uniform. This allows the gas passing through the space 54i of the heat-resistant enclosure 54 to be uniformly heated or cooled. As described above, gas having a desired temperature can be stably obtained without increasing the thermal capacity of the heating element 51 or increasing the area of the heating element 51, so that it is possible to improve the response when heating or cooling the gas.

Further, making the temperature of the heating element 51 uniform during heating or cooling can prevent the heating element 51 from being partially heated to a high temperature, so that it is possible to prevent the heating element 51 from melting and fulfill gas heating with a long life and no contamination.

Further, in the semiconductor manufacturing apparatus, the process is performed while controlling the temperature of the gas flowing out from the gas heating apparatus 11a to a temperature set for each step of the recipe corresponding to the process by controlling the electric power supplied to the induction coil 57 of the gas heating apparatus 11a.

This makes the response when the gas heating apparatus 11a heats or cools the gas faster and eliminates the need of preparing a plurality of supply systems and selecting a supply system from among the plurality of supply systems for each temperature so as to selectively use gases having different temperatures during the execution of the process, thereby making the structure of the supply system simple.

Further, the temperature of the gas is controlled to a temperature set for each step of the recipe of the process, so that it is possible to heat, without difficulty, the gas to a constant temperature, for example, only during the execution of the chemical liquid process such as an etching process, a removal process, or the like for about 1 minute.

Further, a Bernoulli chuck mechanism is used as means for holding the semiconductor wafer 1 in the related art, but the flow rate of used gas is high, so that the use of gases having different temperatures in the process performed on the semiconductor wafer 1 at a predetermined chemical liquid temperature deteriorates the uniformity of the process. According to the first preferred embodiment, however, the gas is supplied to the surface opposed to the processing surface of the semiconductor wafer 1 in order to hold the semiconductor wafer 1, so that adjusting the temperature of the gas to the process temperature of the semiconductor wafer 1 improves the uniformity of the process.

Further, the gas used in the process performed on the processing surface of the semiconductor wafer 1 is supplied to the surface opposed to the processing surface of the semiconductor wafer 1 in order to prevent the chemical liquid discharged from the chemical liquid nozzle 6 from flowing around to the surface opposed to the processing surface of the semiconductor wafer 1.

Examples of the gas supplied to the surface opposed to the processing surface of the semiconductor wafer 1 include a seal gas for preventing the chemical liquid discharged to the processing surface of the semiconductor wafer 1 from flowing around to a lower surface of a bevel portion. When the semiconductor wafer 1 is processed at a predetermined chemical liquid temperature, the use of gases having different temperatures as the seal gas deteriorates the uniformity of the process.

On the other hand, according to the first preferred embodiment, the temperature of the gas is adjusted by the gas heating apparatus 11a, so that setting the temperature of the gas to the process temperature of the semiconductor wafer 1 improves the uniformity of the process.

As shown in FIG. 2, the heating element 51 has the first main surface and the second main surface opposed to the first main surface and is provided with the plurality of through holes 51a2 passing through from the first main surface to the second main surface. This causes gas passing along the upper surface of the heating element 51 having a flat plate shape and gas passing along the lower surface of the heating element 51 to pass through the through holes 51a2 to come into contact with each other to generate a turbulent flow, thereby allowing nearby gas to be agitated and allowing the temperature to become uniform.

Further, as shown in FIG. 3, the heating element 51 has the first main surface and the second main surface opposed to the first main surface and is provided with the plurality of irregularities over the first main surface and the second main surface. This causes gas passing along the upper surface of the heating element 51 having a flat plate shape and gas passing along the lower surface of the heating element 51 to pass through the plurality of irregularities to generate a turbulent flow on both the upper surface and the lower surface, thereby allowing nearby gas to be agitated and allowing the temperature to become uniform.

Second Preferred Embodiment

Figure 10:
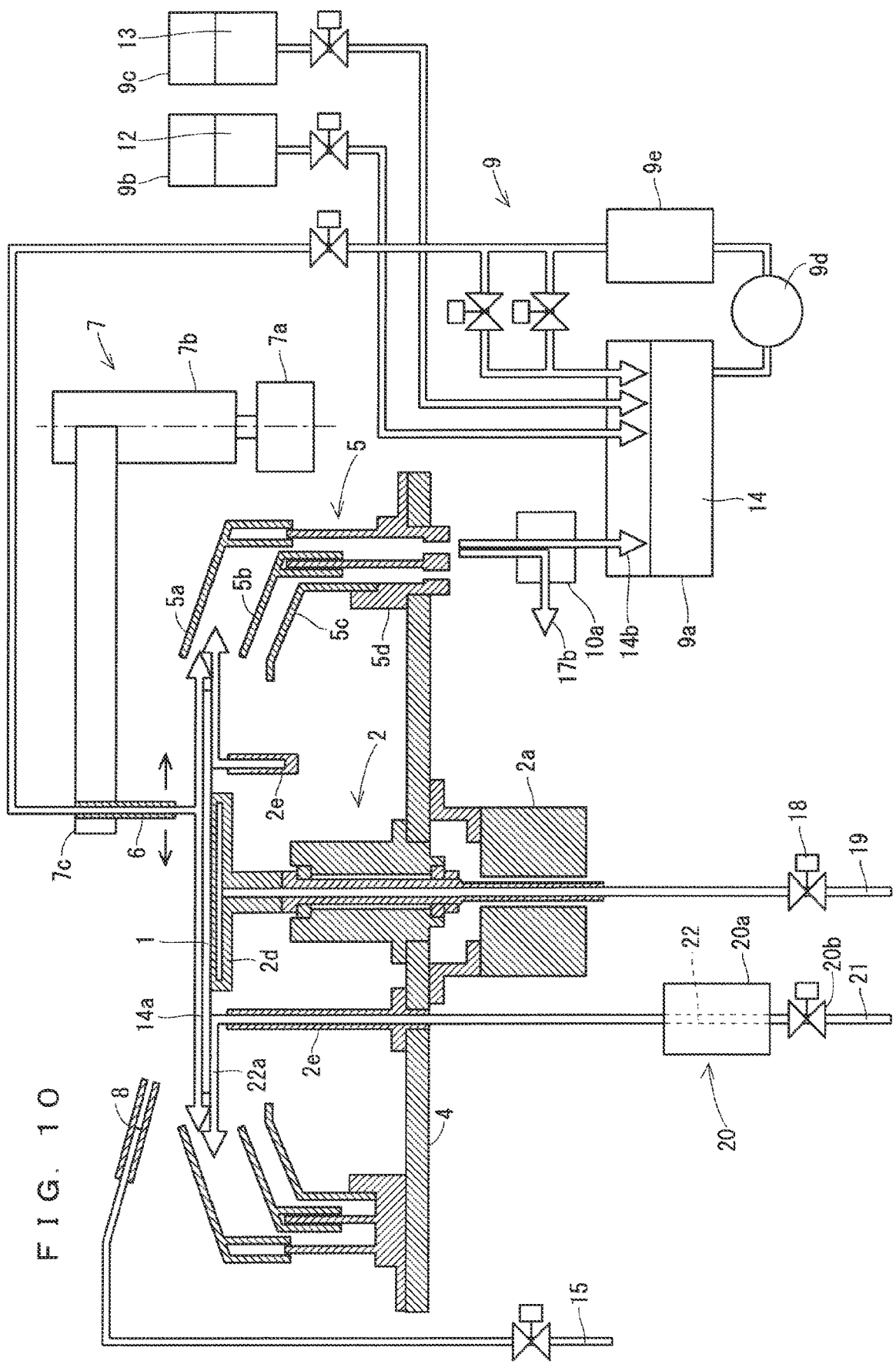
FIG. 10 is a cross-sectional view showing a chemical liquid process in a processing chamber of a semiconductor manufacturing apparatus according to a second preferred embodiment.

Next, a description will be given of a semiconductor manufacturing apparatus according to a second preferred embodiment. FIG. 10 is a cross-sectional view showing a chemical liquid process in a processing chamber of the semiconductor manufacturing apparatus according to the second preferred embodiment. Note that, in the second preferred embodiment, the same components as those described in the first preferred embodiment are denoted by the same reference numerals, and descriptions thereof will be omitted.

As shown in FIG. 10, the semiconductor manufacturing apparatus includes a stage rotation mechanism 2, a platen 4, a cup lift mechanism 5, a chemical liquid nozzle 6, a chemical liquid nozzle scan mechanism 7, a water nozzle 8, a chemical liquid temperature control circulation discharge mechanism 9, a first gas-liquid separator 10a, an on-off valve 18, and a lower surface gas temperature control discharge mechanism 20.

According to the first preferred embodiment, the semiconductor manufacturing apparatus includes the chuck opening and closing mechanism 3 that holds the semiconductor wafer 1 from the side surface of the semiconductor wafer 1 using the chuck pin 3b. On the other hand, according to the second preferred embodiment, the stage rotation mechanism 2 includes a suction chuck stage 2d that draws the lower surface of the semiconductor wafer 1 to hold the semiconductor wafer 1 and is not configured to supply the temperature-controlled gas from the center portion to the outer periphery of the lower surface of the semiconductor wafer 1.

Further, according to the second preferred embodiment, the semiconductor manufacturing apparatus includes the lower surface gas temperature control discharge mechanism 20 instead of the lower surface gas temperature control discharge mechanism 11. The lower surface gas temperature control discharge mechanism 20 includes a gas heating apparatus 20a and an on-off valve 20b. The on-off valve 20b is disposed adjacent to an inlet of the gas heating apparatus 20a. Note that the gas heating apparatus 20a is the same in configuration as the gas heating apparatus 11a.

Controlling electric power supplied to an induction coil 57 of the gas heating apparatus 20a controls a temperature of gas flowing out from the gas heating apparatus 20a. Specifically, the gas heating apparatus 20a is controlled on the basis of the electric power supplied to the induction coil 57 to heat or cool the gas to a temperature set for each step of a recipe corresponding to the process performed on the processing surface of the semiconductor wafer 1.

With the electric power supplied to the induction coil 57, opening the on-off valve 20b changes ambient temperature gas 21 to temperature-controlled by the gas heating apparatus 20a to become temperature-controlled gas 22 and supplied to the lower surface gas nozzle 2e. On the other hand, with no electric power supplied to the induction coil 57, opening the on-off valve 20b causes the ambient temperature gas 21 to pass through the gas heating apparatus 20a without being temperature-controlled by the gas heating apparatus 20a and supplied to the lower surface gas nozzle 2e as it is. The lower surface gas nozzle 2e is a nozzle for supplying the gas flowing out from the gas heating apparatus 20a to the semiconductor wafer 1 during the execution of the process on the processing surface of the semiconductor wafer 1. Herein, the process that is associated with the lower surface gas nozzle 2e and is performed on the processing surface of the semiconductor wafer 1 includes a chemical liquid process, a water washing process, and a drying process performed in the processing chamber.

When a vacuum 19 produced by the on-off valve 18 acts on the suction chuck stage 2d, the center portion of the lower surface of the semiconductor wafer 1 is brought into close contact with the suction chuck stage 2d.

Therefore, during the execution of the chemical liquid process, in order to prevent the chemical liquid 14a on the upper surface of the semiconductor wafer 1 from flowing along the end portion of the semiconductor wafer 1 to the lower surface due to surface tension, the temperature-controlled gas 22 whose temperature has been controlled by the gas heating apparatus 20a to a predetermined temperature appropriate to the chemical liquid temperature is supplied from the lower surface gas nozzle 2e having a ring shape and positioned outside the suction chuck stage 2d.

This makes it possible to ensure sufficient in-plane uniformity in the chemical liquid process. Temperature-controlled gas 22a on the lower surface of the semiconductor wafer 1 is exhausted by the first cup 5a together with an atmosphere on the upper surface of the semiconductor wafer 1 and then becomes temperature-controlled gas 22b to be released through the first gas-liquid separator 10a.

When the chemical liquid process is completed, the discharge of the chemical liquid 14 is stopped, the chemical liquid nozzle scan mechanism 7 is returned to a standby position, the second cup 5b is lifted, and the water washing process is started.

During the execution of the water washing process, in order to prevent the water 15a (see FIG. 7) on the upper surface of the semiconductor wafer 1 from flowing along the end portion of the semiconductor wafer 1 to the lower surface due to surface tension, the ambient temperature gas 21 passing through the gas heating apparatus 20a is supplied from the lower surface gas nozzle 2e having a ring shape and positioned outside the suction chuck stage 2d.

Note that the amount of heat conducted from the semiconductor wafer 1 to the water 15a is large during the execution of the water washing process, so that high-temperature gas during the conversion of the temperature-controlled gas 22 to the ambient temperature gas 21 is acceptable in most cases, and there is no problem even when the temperature-controlled gas 22 remains as it is in consideration of the next drying process.

During the execution of the drying process, in order to prevent the water 15a (see FIG. 7) on the upper surface of the semiconductor wafer 1 from flowing along the end portion of the semiconductor wafer 1 to the lower surface due to surface tension and droplets splashing off the second cup 5b from moving to the lower surface and to further accelerate the drying of the semiconductor wafer 1, the temperature-controlled gas 22 whose temperature has been controlled by the gas heating apparatus 20a to a predetermined temperature suitable for the drying is supplied from the lower surface gas nozzle 2e having a ring shape and positioned outside the suction chuck stage 2d.

The supply of the temperature-controlled gas 22 whose temperature is higher than the ambient temperature heats the semiconductor wafer 1 to allow a drying time to be shortened.

The temperature-controlled gas 22a on the lower surface of the semiconductor wafer 1 is exhausted by the second cup 5b together with the atmosphere on the upper surface of the semiconductor wafer 1 and then becomes the temperature-controlled gas 22b to be released through the second gas-liquid separator 10b.

Effect

As described above, the semiconductor manufacturing apparatus according to the second preferred embodiment allows an improvement in response when heating or cooling the gas as in the first preferred embodiment. Further, making the response when the gas heating apparatus 20a heats or cools the gas faster eliminates the need of preparing a plurality of supply systems and selecting a supply system from among the plurality of supply systems for each temperature so as to selectively use gases having different temperatures during the execution of the process, thereby making the structure of the supply system simple.

Further, as in the first preferred embodiment, the gas used in the process performed on the processing surface of the semiconductor wafer 1 is supplied to the surface opposed to the processing surface of the semiconductor wafer 1 in order to prevent the chemical liquid discharged from the chemical liquid nozzle 6 from flowing around to the surface opposed to the processing surface of the semiconductor wafer 1. The temperature of the gas is adjusted by the gas heating apparatus 20a, so that setting the temperature of the gas to the process temperature of the semiconductor wafer 1 improves the uniformity of the process.

Third Preferred Embodiment

Figure 11:
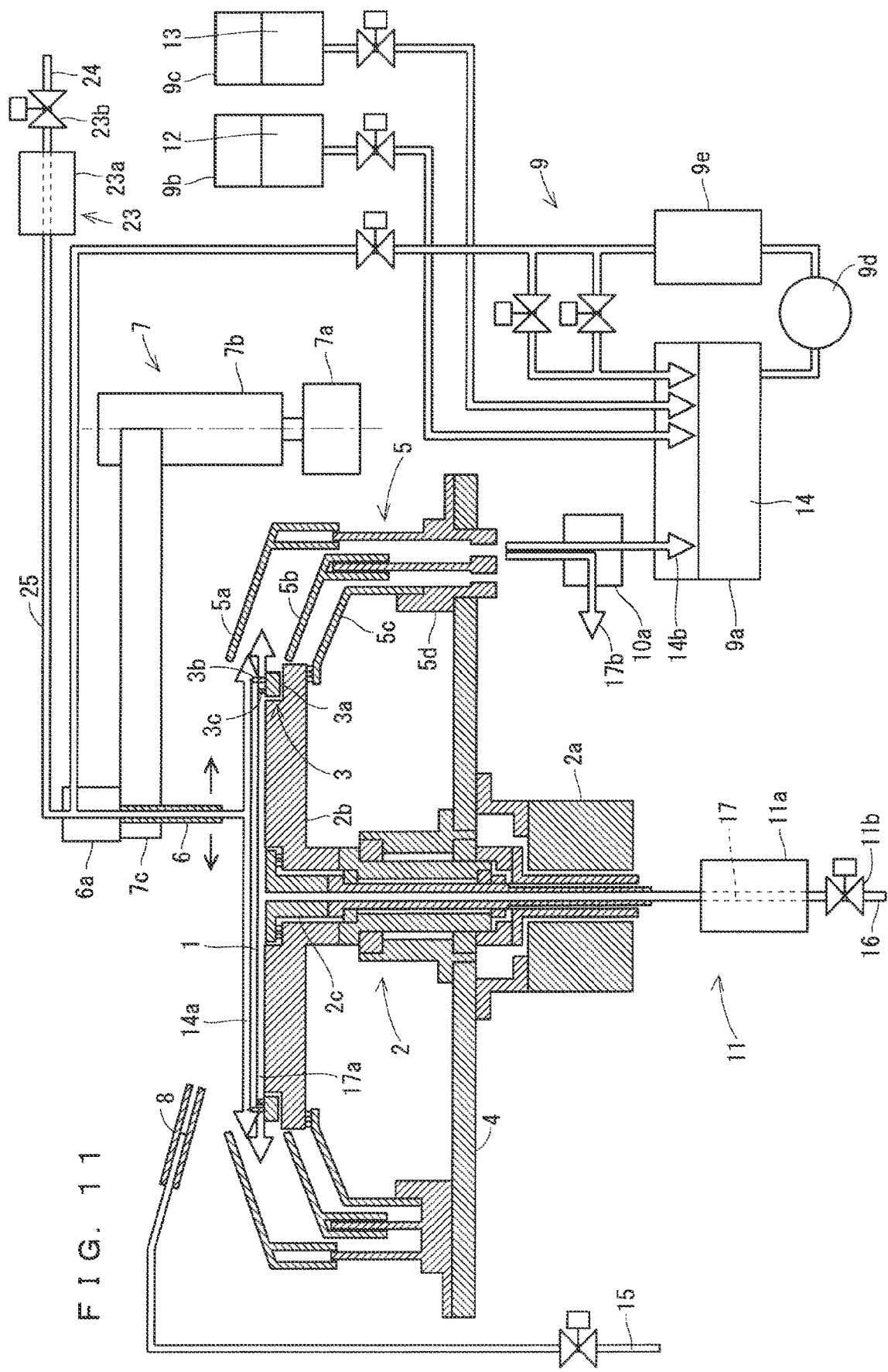
FIG. 11 is a cross-sectional view showing a chemical liquid process in a processing chamber of a semiconductor manufacturing apparatus according to a third preferred embodiment.

Next, a description will be given of a semiconductor manufacturing apparatus according to a third preferred embodiment. FIG. 11 is a cross-sectional view showing a chemical liquid process in a processing chamber of the semiconductor manufacturing apparatus according to the third preferred embodiment. Note that, in the third preferred embodiment, the same components as those described in the first and second preferred embodiments are denoted by the same reference numerals, and descriptions thereof will be omitted.

As shown in FIG. 11, the semiconductor manufacturing apparatus includes a stage rotation mechanism 2, a chuck opening and closing mechanism 3, a platen 4, a cup lift mechanism 5, a two-fluid chemical liquid nozzle 6a, a chemical liquid nozzle scan mechanism 7, a water nozzle 8, a chemical liquid temperature control circulation discharge mechanism 9, a first gas-liquid separator 10a, a lower surface gas temperature control discharge mechanism 11, and a chemical liquid gas temperature control discharge mechanism 23.

According to the third preferred embodiment, the semiconductor manufacturing apparatus includes, instead of the chemical liquid nozzle 6, the two-fluid chemical liquid nozzle 6a that discharges a mixture of a chemical liquid and a gas used in the process performed on the processing surface of the semiconductor wafer 1.

The chemical liquid gas temperature control discharge mechanism 23 includes a gas heating apparatus 23a and an on-off valve 23b. The on-off valve 23b is disposed adjacent to an inlet of the gas heating apparatus 23a. Note that the gas heating apparatus 23a is the same in configuration as the gas heating apparatus 11a.

Controlling electric power supplied to an induction coil 57 of the gas heating apparatus 23a controls a temperature of gas flowing out from the gas heating apparatus 23a. Specifically, the gas heating apparatus 23a is controlled on the basis of the electric power supplied to the induction coil 57 to heat or cool the gas to a temperature set for each step of a recipe corresponding to the process performed on the processing surface of the semiconductor wafer 1.

With the electric power supplied to the induction coil 57, opening the on-off valve 23b changes ambient temperature gas 24 to temperature-controlled by the gas heating apparatus 23a to become temperature-controlled gas 25 and supplied to the two-fluid chemical liquid nozzle 6a. On the other hand, with no electric power supplied to the induction coil 57, opening the on-off valve 23b causes the ambient temperature gas 24 to pass through the gas heating apparatus 23a without being temperature-controlled by the gas heating apparatus 23a and supplied to the two-fluid chemical liquid nozzle 6a as it is. The two-fluid chemical liquid nozzle 6a is a nozzle for supplying the gas flowing out from the gas heating apparatus 23a to the semiconductor wafer 1 during the execution of the process on the processing surface of the semiconductor wafer 1. Herein, the process that is associated with the two-fluid chemical liquid nozzle 6a and is performed on the processing surface of the semiconductor wafer 1 includes a chemical liquid process performed in the processing chamber.

When the semiconductor wafer 1 is processed at a predetermined chemical liquid temperature, it is necessary for the two-fluid chemical liquid nozzle 6a to mix gas having a temperature substantially equal to or higher than the chemical liquid temperature with the chemical liquid in order to increase the strength of cleaning, and heating or cooling means with high responsivity is indispensable. The flow rate of the gas used in the two-fluid chemical liquid nozzle 6a is about one quarter of the flow rate during the wafer holding described in the first preferred embodiment. Therefore, even when the gas heating apparatus 23a having the same configuration as in the first preferred embodiment is used, the response when heating gas is as short as about one half of the response in the first preferred embodiment, and it is therefore possible to cope with a case where the supply of electric power is enabled or disabled for each process on the semiconductor wafer 1 without difficulty. This eliminates the need of supplying, without interruption, the temperature-controlled gas 25 to the two-fluid chemical liquid nozzle 6a.

Effect

As described above, the semiconductor manufacturing apparatus according to the third preferred embodiment allows an improvement in response when heating or cooling the gas as in the first preferred embodiment.

Further, the gas used in the process performed on the processing surface of the semiconductor wafer 1 is mixed with the chemical liquid and discharged from the two-fluid chemical liquid nozzle 6a to the processing surface of the semiconductor wafer 1, so that it is possible to increase the strength of cleaning of the processing surface of the semiconductor wafer 1.

Note that the present disclosure can be implemented by any combination of the preferred embodiments, and each of the preferred embodiments can be modified or omitted as appropriate.

While the disclosure has been shown and described in detail, the foregoing description is in all aspects illustrative and not restrictive. It is therefore understood that numerous modifications and variations can be devised.

What is claimed is:

1. A gas heating apparatus comprising:
a heating element having a flat plate shape;
a heat-resistant enclosure in which a space having a flat plate shape is provided, the heating element being disposed in the space with a gap provided between the heating element and an innermost surface of the heat-resistant enclosure such that the heating element is spaced from the innermost surface of the heat-resistant enclosure;
a gas inlet joint connected to the heat-resistant enclosure to allow gas to flow into the space;
a gas outlet joint connected to the heat-resistant enclosure to allow the gas that has passed through the space to flow out; and
an induction coil disposed in parallel with the heating element on a lower surface of the heat-resistant enclosure, the lower surface of the heat-resistant enclosure being between the induction coil and the heating element, the induction coil being configured to inductively heat the heating element on the basis of electric power supplied, wherein
the heat-resistant enclosure comprises a straightening plate partially disposed in the space,
the straightening plate comprises a straightening plate portion facing the heating element and a conduit portion extending upward from the straightening plate portion,
the heating element is positioned below a lower surface of the straightening plate portion and is spaced from the straightening plate portion, and
the straightening plate portion extends to an inner perimeter of the space.

2. A semiconductor manufacturing apparatus comprising:
the gas heating apparatus according to claim 1;
a chuck stage on which a semiconductor wafer is placed; and
a nozzle configured to supply the gas flowing out from the gas heating apparatus to the semiconductor wafer during execution of a process on a processing surface of the semiconductor wafer.

3. The semiconductor manufacturing apparatus according to claim 2, wherein
the semiconductor manufacturing apparatus is configured such that the gas used in the process is capable of being supplied to a surface opposed to the processing surface of the semiconductor wafer to hold the semiconductor wafer.

4. The semiconductor manufacturing apparatus according to claim 2, further comprising a chemical liquid nozzle configured to discharge a chemical liquid onto the processing surface of the semiconductor wafer, wherein
the semiconductor manufacturing apparatus is configured such that the gas used in the process is capable of being supplied to a surface opposed to the processing surface of the semiconductor wafer to prevent the chemical liquid discharged from the chemical liquid nozzle from flowing around to the surface opposed to the processing surface of the semiconductor wafer.

5. The semiconductor manufacturing apparatus according to claim 2, wherein
the nozzle is a two-fluid chemical liquid nozzle configured to discharge a mixture of a chemical liquid and the gas used in the process, and
the two-fluid chemical liquid nozzle is configured to discharge the gas used in the process mixed with the chemical liquid to the processing surface of the semiconductor wafer.

6. The gas heating apparatus according to claim 1, wherein the heating element comprises:
a first main surface and a second main surface opposed to the first main surface; and
a plurality of through holes passing through from the first main surface to the second main surface.

7. The gas heating apparatus according to claim 1, wherein the heating element comprises:
a first main surface and a second main surface opposed to the first main surface; and
a plurality of irregularities provided over the first main surface and the second main surface.

8. A semiconductor manufacturing method using the semiconductor manufacturing apparatus according to claim 2, the method comprising:
performing a wafer processing process of discharging a chemical liquid onto the processing surface of the semiconductor wafer while rotating the semiconductor wafer to process the processing surface of the semiconductor wafer,
in the wafer processing process, the gas flowing out from the gas heating apparatus is supplied to a surface opposed to the processing surface of the semiconductor wafer.

9. The semiconductor manufacturing method according to claim 8, wherein
in the wafer processing process, the chemical liquid is mixed with the gas flowing out from the gas heating apparatus and discharged.

10. A semiconductor manufacturing method using the semiconductor manufacturing apparatus according to claim 2, comprising:
performing the process while controlling a temperature of the gas flowing out from the gas heating apparatus to a temperature set for each step of a recipe corresponding to the process by controlling the electric power supplied to the induction coil of the gas heating apparatus.

11. The semiconductor manufacturing method according to claim 10, wherein the gas used in the process is supplied to a surface opposed to the processing surface of the semiconductor wafer to hold the semiconductor wafer.

12. The semiconductor manufacturing method according to claim 10, wherein
the semiconductor manufacturing apparatus further comprises a chemical liquid nozzle that discharges a chemical liquid onto the processing surface of the semiconductor wafer, and
the gas used in the process is supplied to a surface opposed to the processing surface of the semiconductor wafer to prevent the chemical liquid discharged from the chemical liquid nozzle from flowing around to the surface opposed to the processing surface of the semiconductor wafer.

13. The semiconductor manufacturing method according to claim 10, wherein
the nozzle is a two-fluid chemical liquid nozzle that discharges a mixture of a chemical liquid and the gas used in the process, and the gas used in the process is mixed with the chemical liquid and discharged from the two-fluid chemical liquid nozzle to the processing surface of the semiconductor wafer.

14. The gas heating apparatus according to claim 1, wherein
an entirety of the induction coil is disposed below the lower surface of the heat-resistant enclosure.

15. The gas heating apparatus according to claim 1, wherein
the heat-resistant enclosure comprises a guide plate disposed on a lower side of the heating element, the guide plate being positioned between the induction coil and the heating element, and
the gap is provided between the guide plate and the heating element.

16. The gas heating apparatus according to claim 1, wherein
the gas outlet joint is connected to the heat-resistant enclosure by way of the conduit portion of the straightening plate.

17. The gas heating apparatus according to claim 1, wherein
the straightening plate portion is configured to allow gas to pass through a peripheral portion of the straightening plate portion positioned radially outward from an outer edge of the heating element, and
the straightening plate and the heating element are configured such that gas passing through the peripheral portion of the straightening plate portion in a direction toward the heating element passes radially inward along an upper and a lower surface of the heating element.

18. The gas heating apparatus according to claim 1, wherein
the gas inlet joint and the gas outlet joint are disposed on a same side of the heating element.

19. The gas heating apparatus according to claim 18, wherein
the same side of the heating element is an upper side of the heating element facing away from the lower surface of the heat-resistant enclosure.

* * * * *